United States Patent [19]
Szeto et al.

[11] Patent Number: 6,021,447
[45] Date of Patent: Feb. 1, 2000

[54] NON-INTRUSIVE IN-SYSTEM PROGRAMMING USING IN-SYSTEM PROGRAMMING CIRCUITRY COUPLED TO OSCILLATION CIRCUITRY FOR ENTERING, EXITING, AND PERFORMING IN-SYSTEM PROGRAMMING RESPONSIVE TO OSCILLATION CIRCUITRY SIGNALS

[75] Inventors: Kinyue Szeto, San Francisco; Charles M. Gracey, Rocklin; Chuck C.W. Cheng, Saratoga, all of Calif.

[73] Assignee: Scenix Semiconductor, Inc., Santa Clara, Calif.

[21] Appl. No.: 08/989,431

[22] Filed: Dec. 12, 1997

[51] Int. Cl.[7] .............................. G06F 1/04; G06F 15/76
[52] U.S. Cl. .................. 710/8; 710/14; 712/32; 712/37; 712/43
[58] Field of Search .................. 712/32, 37, 43; 710/8, 14

[56] References Cited

U.S. PATENT DOCUMENTS

| | | | |
|---|---|---|---|
| 4,646,280 | 2/1987 | Toyosawa | 369/50 |
| 4,727,514 | 2/1988 | Bhuva et al. | 365/104 |
| 5,157,781 | 10/1992 | Harwood et al. | 395/575 |
| 5,278,759 | 1/1994 | Berra et al. | 364/424.01 |
| 5,473,758 | 12/1995 | Allen et al. | 395/430 |
| 5,686,844 | 11/1997 | Hull et al. | 326/38 |
| 5,724,009 | 3/1998 | Collins et al. | 331/108 |
| 5,748,981 | 5/1998 | Patchen et al. | 395/828 |
| 5,790,833 | 8/1998 | Gulick et al. | 395/500 |
| 5,841,996 | 11/1998 | Nolan et al. | 395/309 |
| 5,864,486 | 1/1999 | Deming et al. | 364/489 |

*Primary Examiner*—Thomas C. Lee
*Assistant Examiner*—Rehana Perveen
*Attorney, Agent, or Firm*—Fenwick & West LLP

[57] ABSTRACT

A method and apparatus for In-System Programming which overcomes the above-described disadvantages. The method and apparatus of the ISP system interfaces with the two oscillator (instead of I/O) pins on the microcontroller. By interfacing with the two oscillator pins, the need for extra isolation circuitry to isolate other circuits from the ISP circuits is avoided in most circumstances, without incurring the expense of an expensive JTAG tester or extra dedicated pins. The amount of isolation circuitry necessary is reduced because the two oscillator pins are usually connected to passive components (registers, capacitors, or crystals) which cannot be damaged by the relatively high programming voltages and which do not produce signals that would interfere with the ISP programming signals.

13 Claims, 11 Drawing Sheets

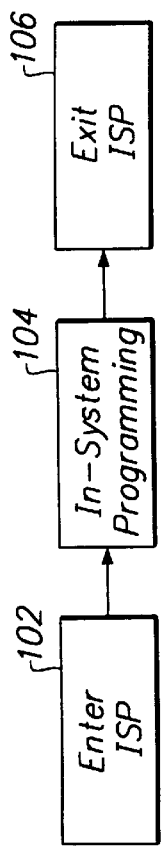
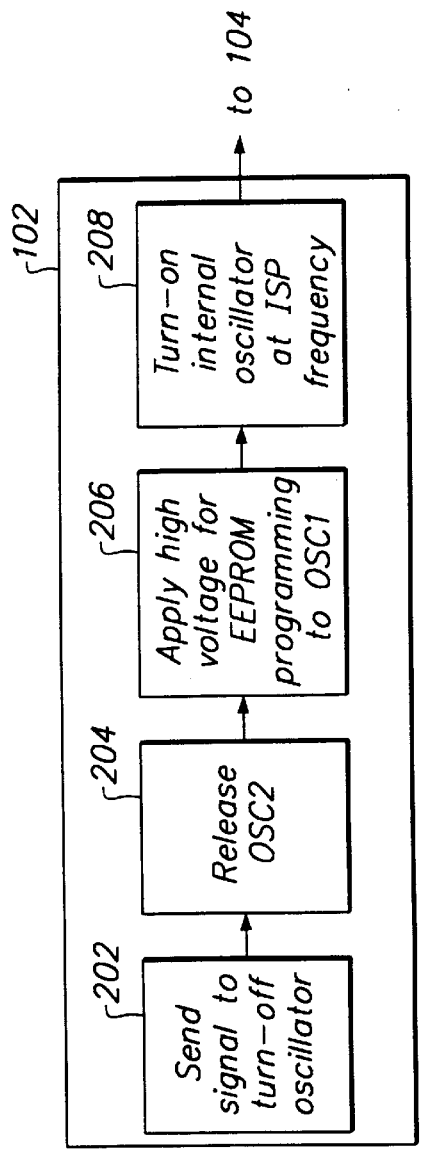
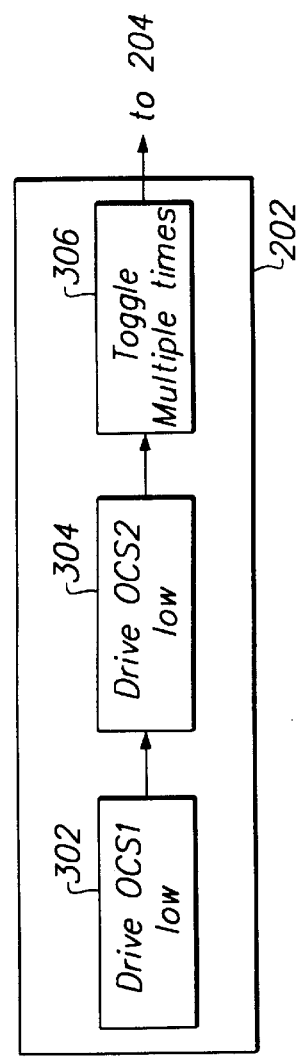
FIG. 1 (Prior Art)
FIG. 2
FIG. 3

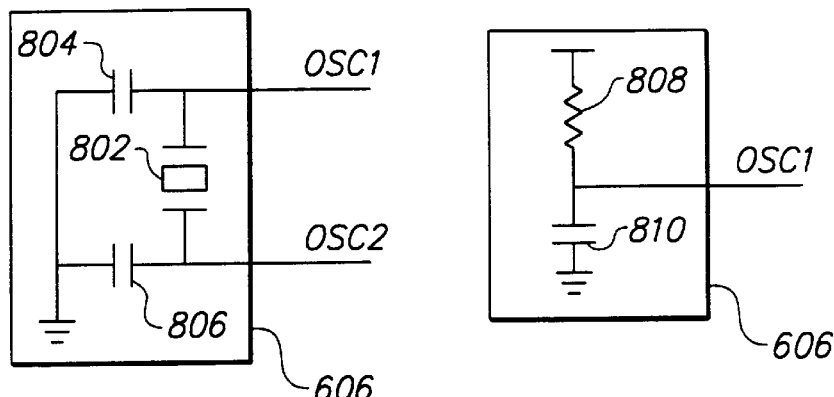
FIG. 8A
(PRIOR ART) XTAL
FIG. 8B
(PRIOR ART) XRC
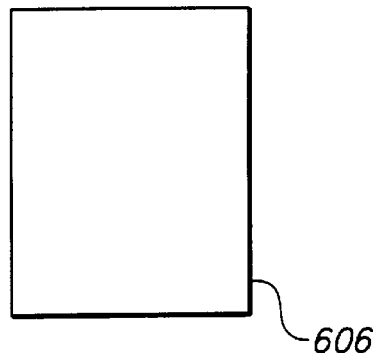
FIG. 8C
(PRIOR ART) IRC
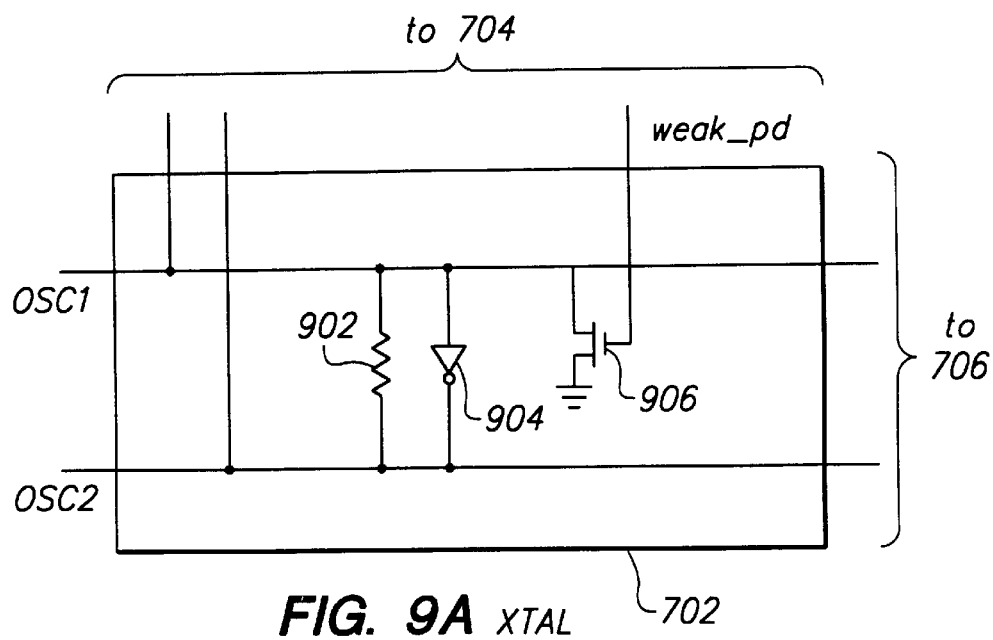
FIG. 9A XTAL

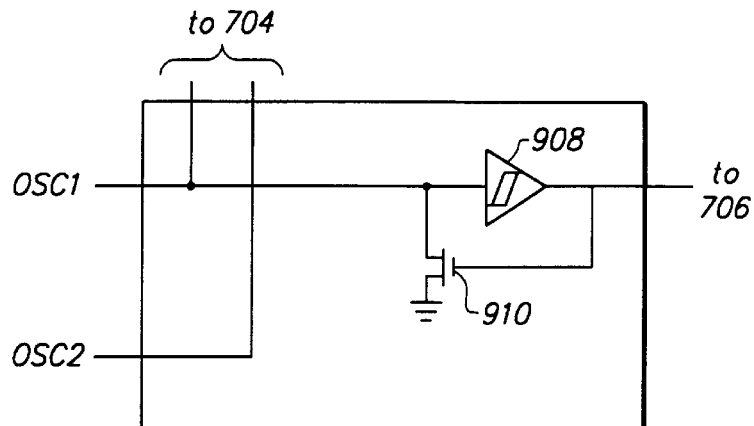
FIG. 9B XRC
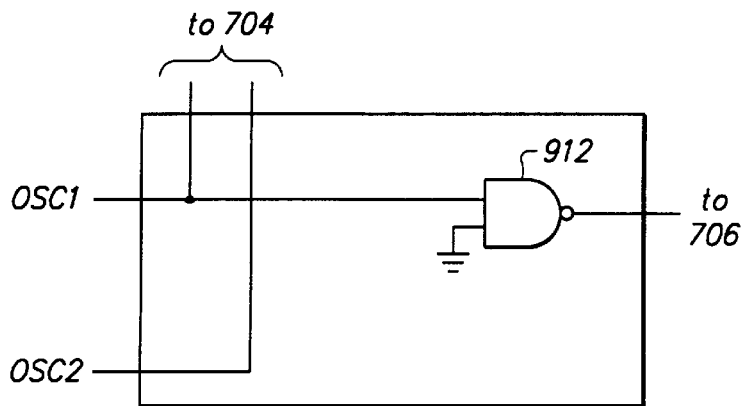
FIG. 9C IRC
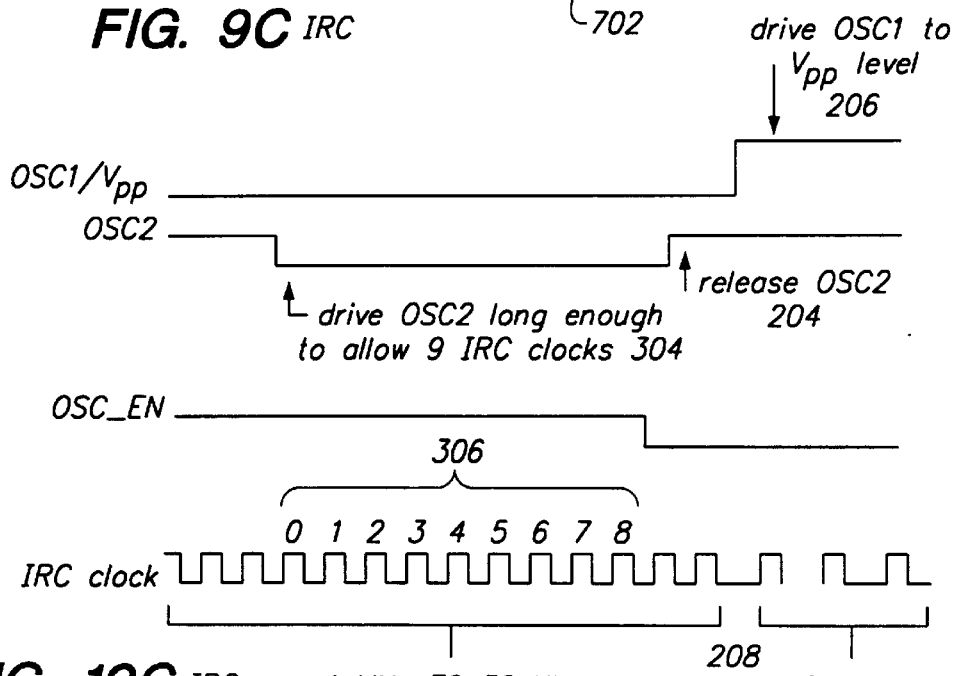
FIG. 10C IRC    4 MHz TO 32 KHz    128 KHz

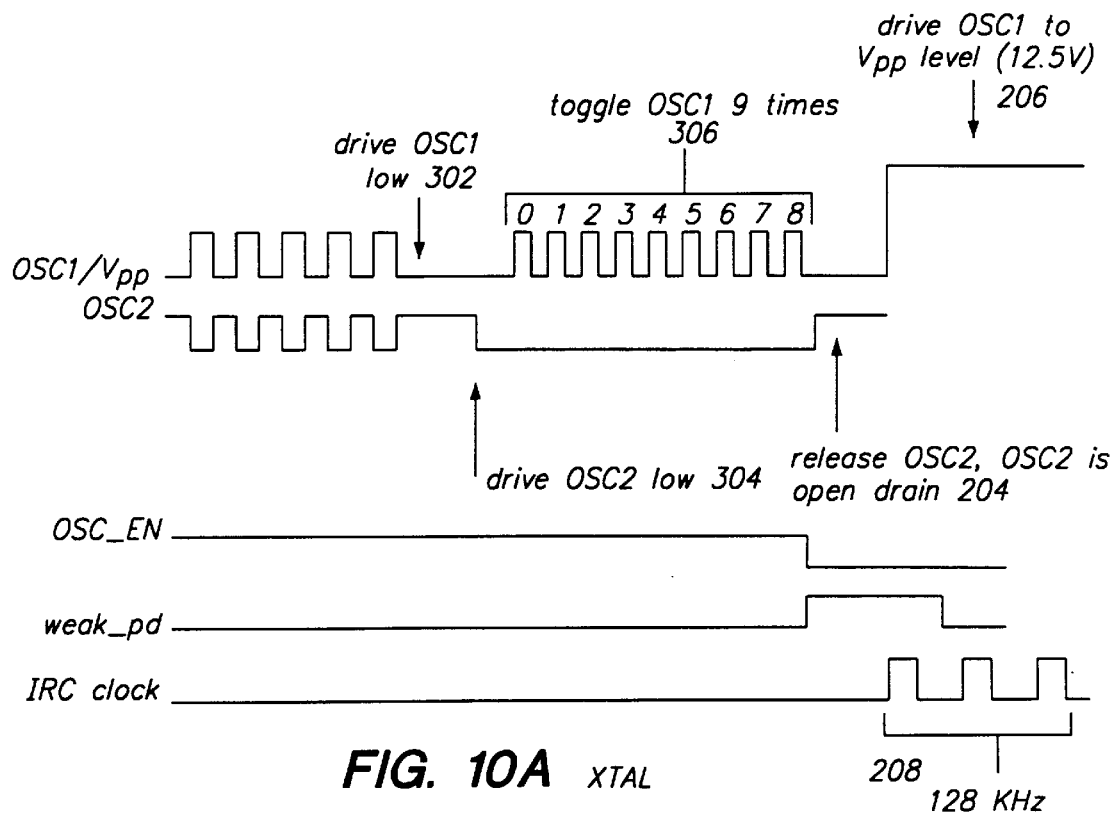
FIG. 10A XTAL
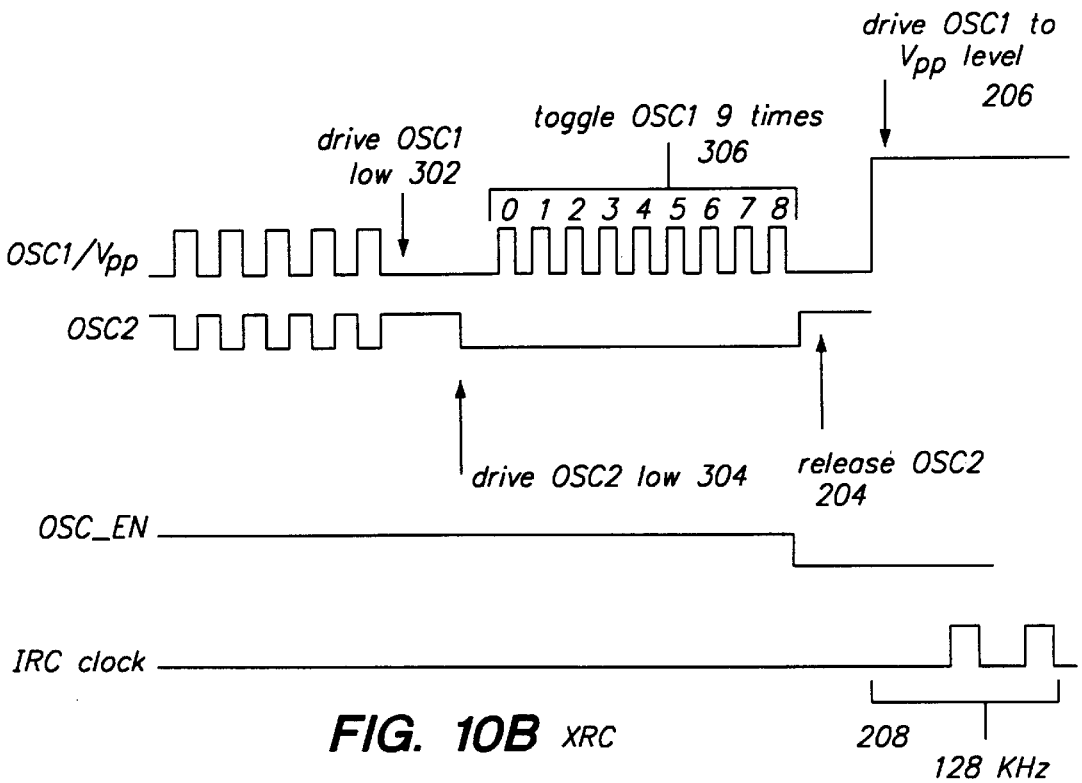
FIG. 10B XRC

ISP Circuitry

Timing for Noise Filter

NON-INTRUSIVE IN-SYSTEM PROGRAMMING USING IN-SYSTEM PROGRAMMING CIRCUITRY COUPLED TO OSCILLATION CIRCUITRY FOR ENTERING, EXITING, AND PERFORMING IN-SYSTEM PROGRAMMING RESPONSIVE TO OSCILLATION CIRCUITRY SIGNALS

I. BACKGROUND OF THE INVENTION

A. Technical Field

The present invention relates to programming memory on a semiconductor chip. More particularly, this invention relates to writing data to and reading data from an EEPROM (electrically erasable programmable read-only memory).

B. Related Art

1. In-System Programming (ISP)

An EEPROM is typically programmed by inserting the EEPROM chip into a socket of a PROM programmer machine. The EEPROM is then mounted on a circuit board of a system (i.e. the system board). Subsequently, if it is desired to re-program the EEPROM, then the EEPROM would typically be removed from the system board and re-inserted into the socket of the PROM programmer. This need to remove the EEPROM from the system board in order to re-program the EEPROM is a disadvantage which may slow-down product development, hinder in-field upgrades/bug fixes, and increase the amount of chips that need to be over-stocked in order to facilitate upgrades/bug fixes.

In-System Programming (ISP) refers to the capability of programming or re-programming a chip while the chip is in place mounted on the system board. In-System Programming allows for speedier product development and facilitates the process of upgrading/fixing bugs in the programming of a chip in a system.

For example, consider developing a microcontroller system including a microcontroller with on-chip EEPROM for storing the programming. With ISP, developing the microcontroller system becomes simpler and faster. During program development, codes in the EEPROM may be updated while the microcontroller is in the actual system board (or a prototype of the system board). The EEPROM may be programmed and re-programmed over many iterations until the program functions as desired and the bugs are fixed. On the other hand, without ISP, the microcontroller has to be removed from the system board and plugged into the separate PROM programmer for each iteration. Since the microcontroller has to be removable from the system board, it is typically socketed instead of soldered onto the system board during development. Not soldering the microcontroller to the system board may complicate the debugging of timing sensitive or noise sensitive designs because of the differences between the soldered and socketed connections.

In addition to the above advantages during development, there are also advantages during manufacturing for such a microcontroller capable of ISP. The system board may be manufactured with the microcontroller permanently mounted before the programming is finalized in order to facilitate a rapid time-to-market Moreover, additional information not available early in the production cycle, such as the vendor identification, may be added to the program at the end of the production cycle. Furthermore, the microcontroller chips do not need to be pre-programmed before production, and pre-programmed microcontroller chips can still be used and re-programmed easily. After production, the microcontroller system can be easily upgraded or fixed in the field with ISP.

2. Prior ISP Techniques

Prior ISP techniques may be grouped into two categories. One category utilizes the JTAG (Joint Technical Assessment Group) boundary scan standard (IEEE 1149.1). Like other parts of the system, the microcontroller may be made to be programmable by a JTAG tester. However, JTAG testers are relatively expensive and are typically used in production but not in development. Furthermore, four additional pins are generally required to implement JTAG.

The other category includes various non-standard techniques which generally utilize an ISP clock pin and an ISP data pin on the microcontroller to send/receive data. The ISP data and clock pins are generally either two pins dedicated to such use, or they are two pins which function as I/O (input/output) pins during normal operation of the microcontroller but function as the ISP data and the ISP clock pins during In-System Programming. However, using two dedicated pins is expensive, and multiplexing usage of regular I/O pins typically requires extra circuitry to isolate the regular I/O circuitry from the ISP circuitry.

II. SUMMARY OF THE INVENTION

The present invention is a proprietary method and apparatus for In-System Programming which overcomes the above-described disadvantages. The method and apparatus of the ISP system interfaces with the two oscillator (instead of I/O) pins on the microcontroller. By interfacing with the two oscillator pins, the need for extra isolation circuitry to isolate other circuits from the ISP circuits is avoided in most circumstances, without incurring the expense of an expensive JTAG tester or extra dedicated pins. The amount of isolation circuitry necessary is reduced because the two oscillator pins are usually connected to passive components (registors, capacitors, or crystals) which cannot be damaged by the relatively high programming voltages and which do not produce signals that would interfere with the ISP programming signals.

III. BRIEF DESCRIPTION OF THE DRAWINGS

FIG. 1 is a flow diagram showing conventional steps in a general process for in-system programming.

FIG. 2 is a flow diagram showing a method for entering in-system programming mode according to a preferred embodiment of the present invention.

FIG. 3 is a flow diagram showing a method for sending a signal to turn-off an oscillator according to a preferred embodiment of the present invention.

FIGS. 8A, 8B, and 8C are circuit diagrams of conventional external oscillation circuits.

FIGS. 9A, 9B, and 9C are circuit diagrams of oscillator interface circuits in a microcontroller according to a preferred embodiment of the present invention.

FIGS. 10A, 10B, and 10C are timing diagrams of signals relating to the method for entering in-system programming mode according to a preferred embodiment of the present invention.

Figure 11:
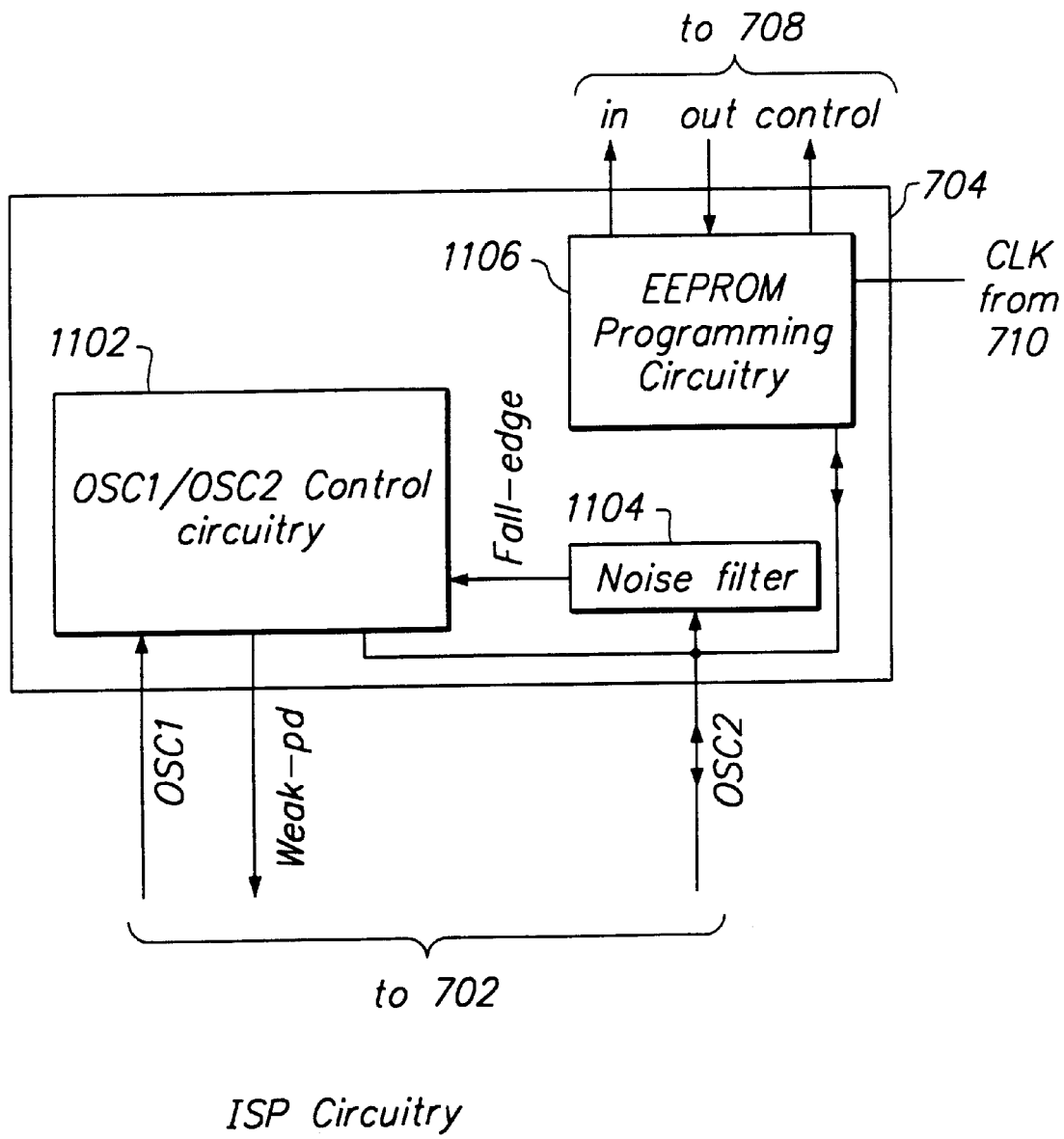

FIG. 11 is a block diagram of in-system programming circuitry in a microcontroller according to a preferred embodiment of the present invention.

Figure 12:
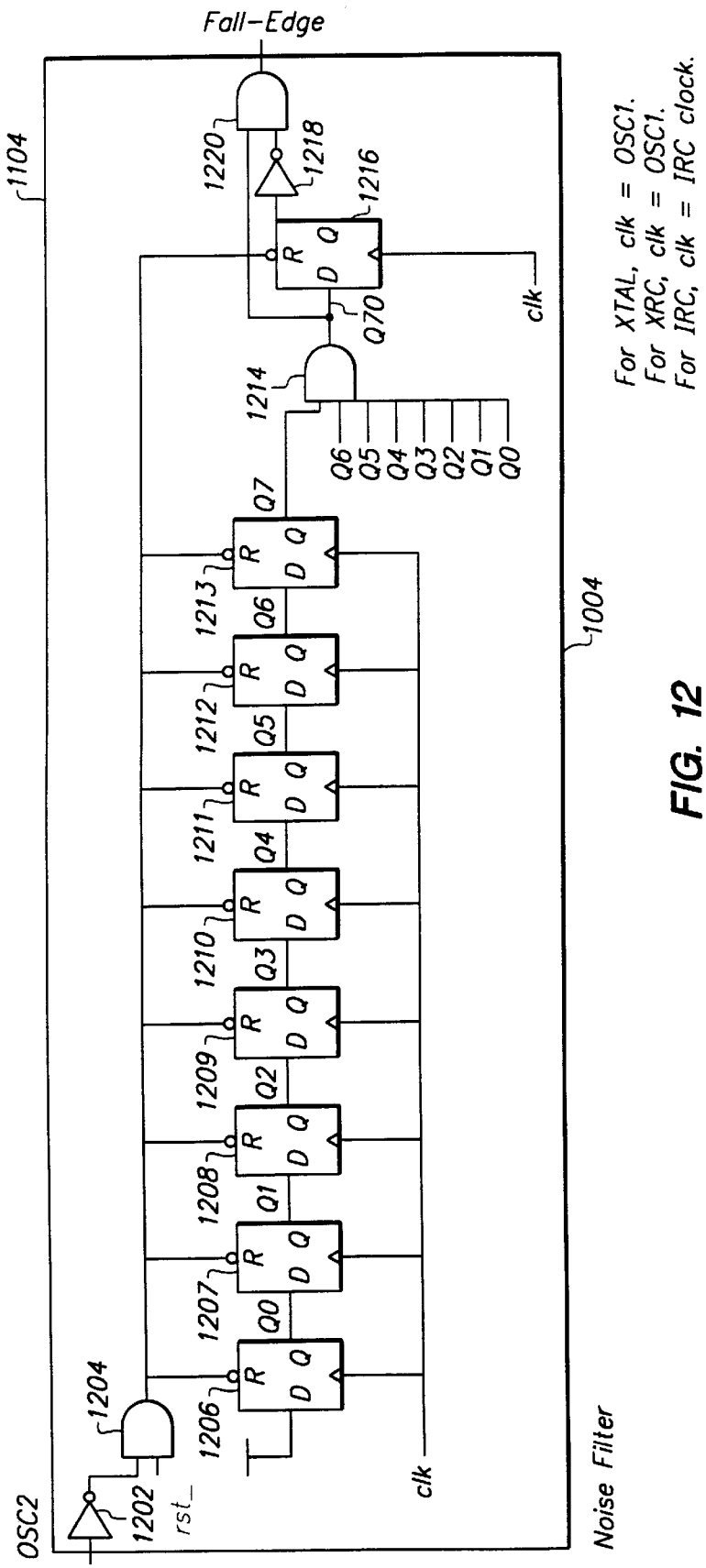

FIG. 12 is a circuit diagram of a noise filter in a microcontroller according to a preferred embodiment of the present invention.

Figure 13:
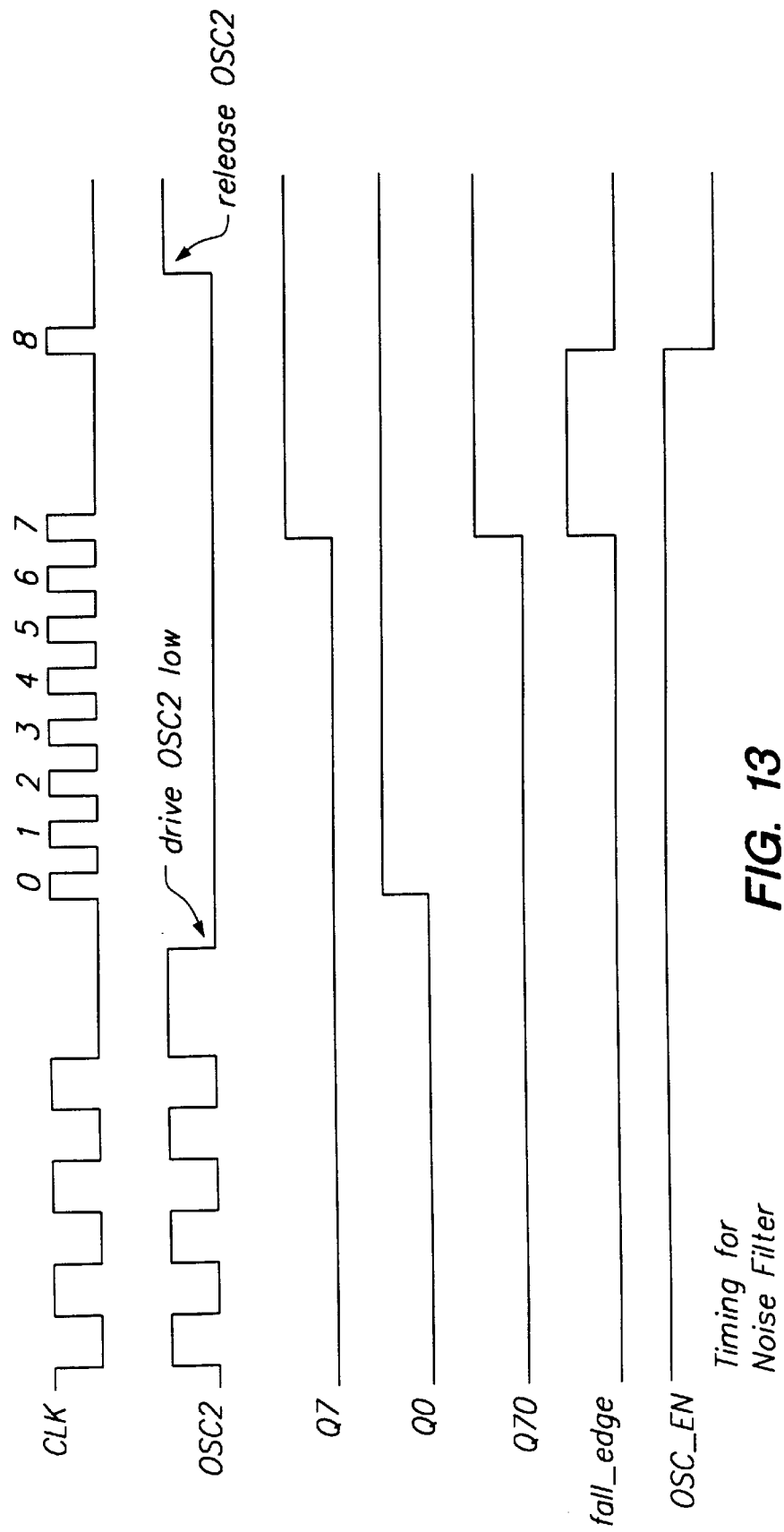

FIG. 13 is a timing diagram of signals in the noise filter according to a preferred embodiment of the present invention.

Figure 14:
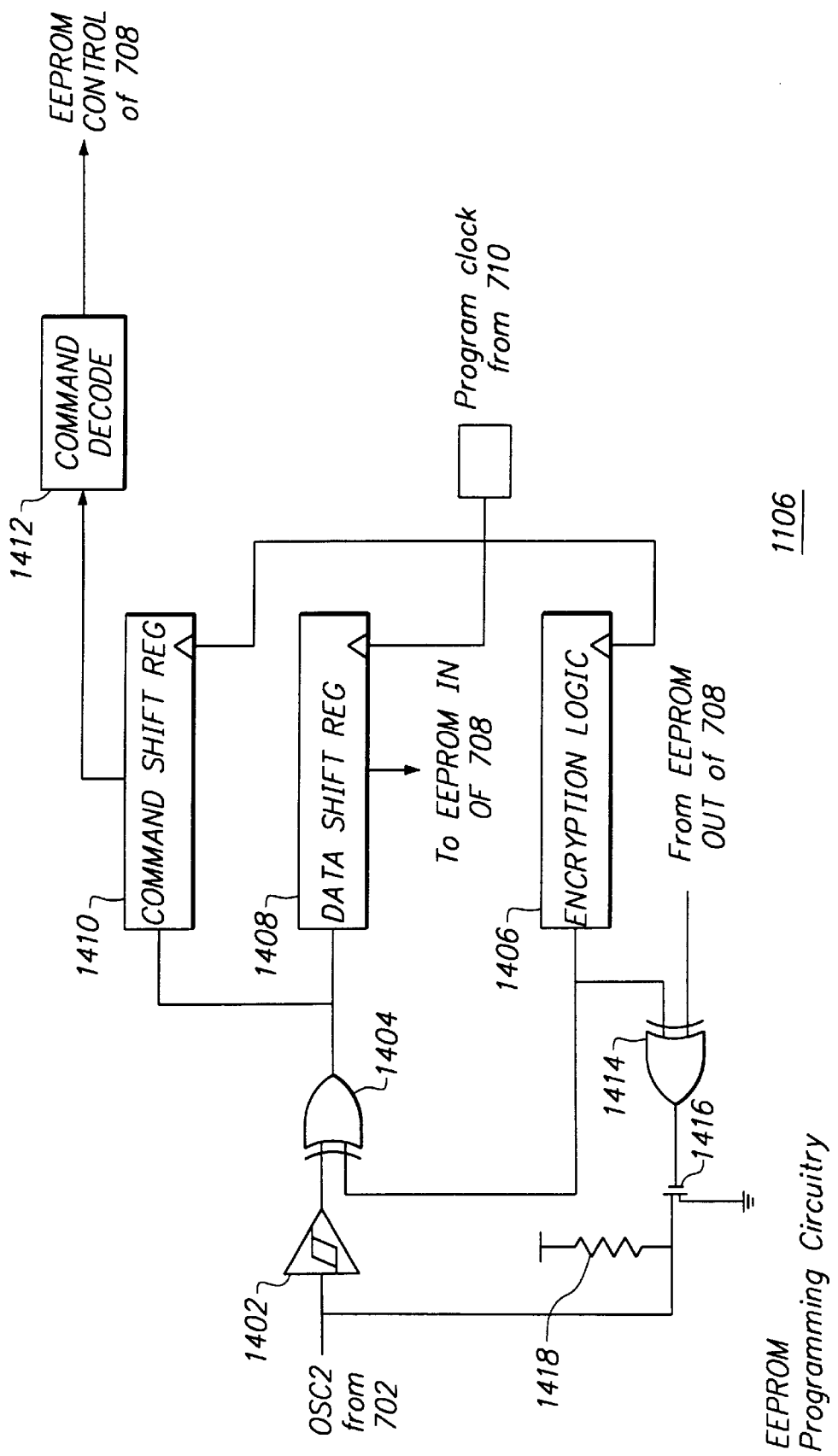

FIG. 14 is a diagram of EEPROM programming circuitry in a microcontroller according to a preferred embodiment of the present invention.

Figure 15:
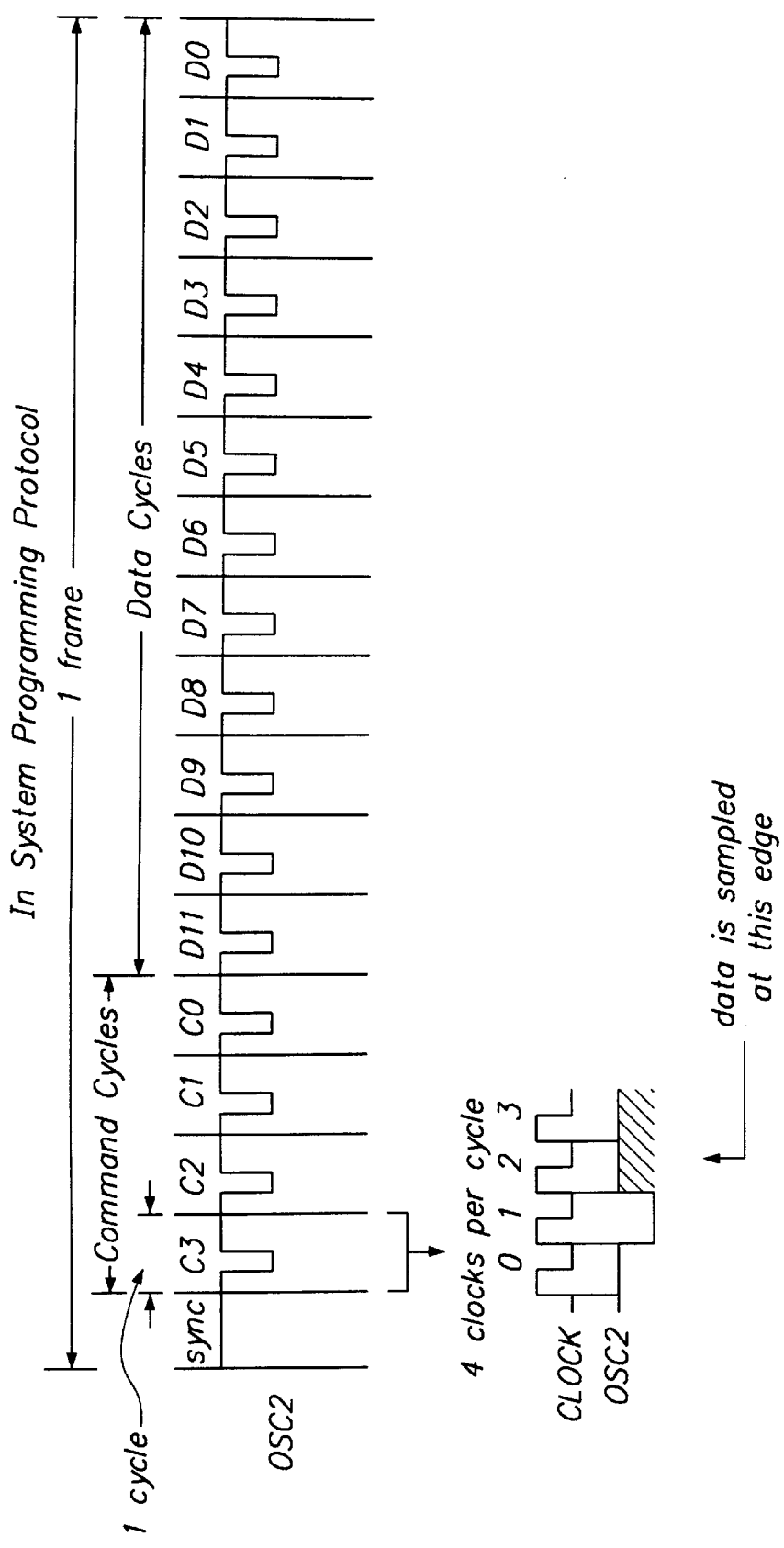

FIG. 15 is a timing diagram of the in-system programming protocol according to a preferred embodiment of the present invention.

IV. DETAILED DESCRIPTION OF THE PREFERRED EMBODIMENTS

FIG. 1 is a flow diagram showing conventional steps in a general process for in-system programming. The general process includes entering in-system programming mode 102, performing in-system programming 104, and exiting in-system programming mode 106.

FIG. 2 is a flow diagram showing a method 102 for entering in-system programming mode according to a preferred embodiment of the present invention. The method 102 includes a first step 202 of sending a signal to turn-off an oscillator for the device to be programmed, a second step 204 of releasing a voltage on a second oscillator pin (OSC2), a third step 206 of applying a relatively high voltage to a first oscillator pin (OSC1) to enable EEPROM programming, and a fourth step 208 of tuning-on an oscillator internal to the device to be programmed at a frequency corresponding to in-system programming cycles.

FIG. 3 is a flow diagram showing a method 202 for sending a signal to turn-off an oscillator according to a preferred embodiment of the present invention. The method 202 includes a first step 302 of driving a voltage on the first oscillator pin (OSC1) low, a second step 304 of driving a voltage on the second oscillator pin (OSC2) low, and a third step 306 of toggling a voltage between low and high multiple times.

Figure 4:
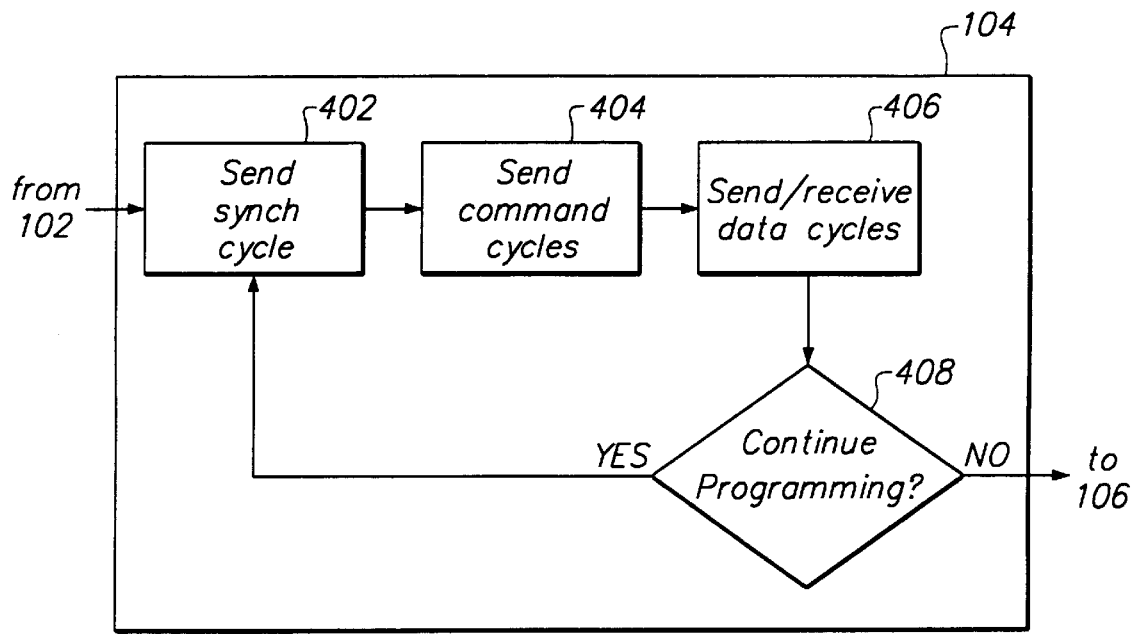
FIG. 4 is a flow diagram showing a method for performing in-system programming according to a preferred embodiment of the present invention.

FIG. 4 is a flow diagram showing a method 104 for performing in-system programming according to a preferred embodiment of the present invention. The method 104 includes: a first step 402 of sending a synchronization cycle from the programming device to the device to be programmed; a second step 404 of sending multiple command cycles from the programming device to the device to be programmed; a third step 406 of either sending multiple data cycles from the programming device to the device to be programmed, or receiving multiple data cycles by the programming device from the device to be programmed; and a fourth step 408 of determining whether or not to continue programming. If it is determined in the fourth step 408 that programming is to be continued, then the method 104 loops back to perform the first step 402. Otherwise, if programming is not to be continued, then the method 104 terminates and in-system programming mode is then exited 106.

Figure 5:
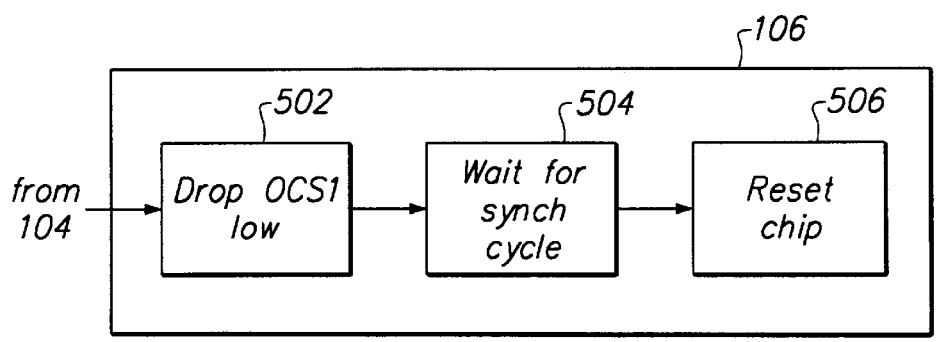
FIG. 5 is a flow diagram showing a method for exiting in-system programming mode according to a preferred embodiment of the present invention.

FIG. 5 is a flow diagram showing a method 106 for exiting in-system programming mode according to a preferred embodiment of the present invention. The method 106 includes a first step 502 of driving a voltage on the first oscillator pin (OSC1) low, a second step 504 of waiting for a synchronization cycle to be sent from the programming device to the device to be programmed, and a third step 506 of resetting the device to be programmed and thus ending in-system programming mode.

Figure 6:
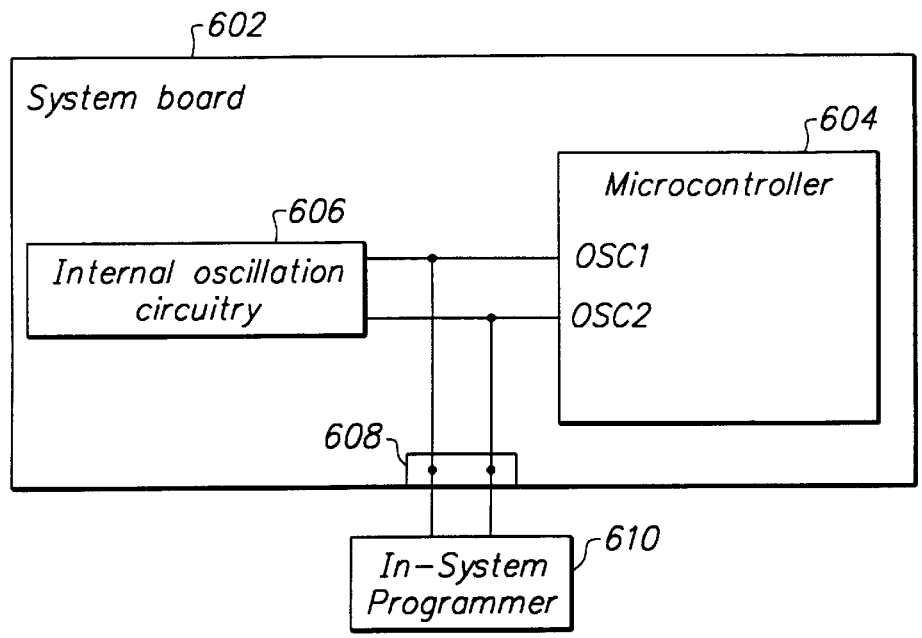
FIG. 6 is a diagram of a system for in-system programming of a microcontroller according to a preferred embodiment of the present invention.

FIG. 6 is a diagram of a system for in-system programming of a microcontroller according to a preferred embodiment of the present invention. The system includes a system board 602 and an in-system programmer machine 610. The system board 602 comprises a microcontroller 604, external oscillation circuitry 606, and a connector 608. The microcontroller 604 includes two oscillator pins (OSC1 and OSC2) which couple to the external oscillation circuitry 606 and to the connector 608. The connector 608 is further coupled to the in-system programmer 610.

Figure 7:
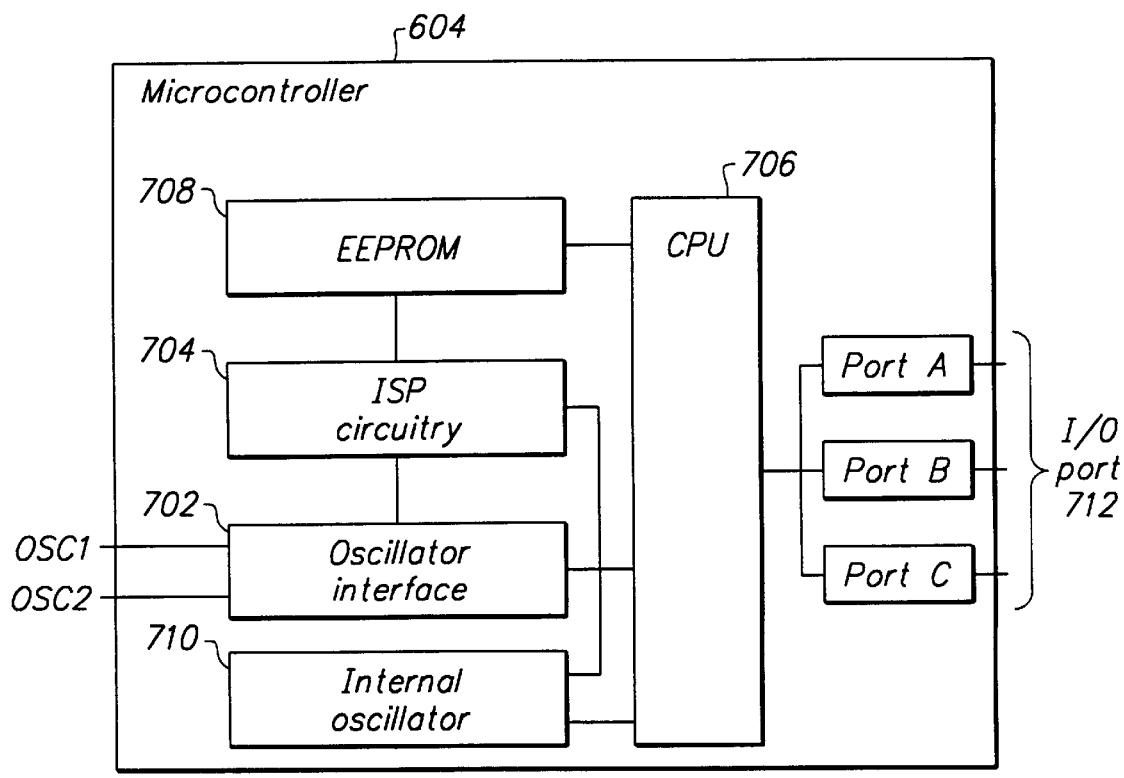
FIG. 7 is a block diagram of a microcontroller according to a preferred embodiment of the present invention.

FIG. 7 is a block diagram of a microcontroller 604 according to a preferred embodiment of the present invention. The microcontroller 604 includes two oscillator pins (OSC1 and OSC2), an oscillator interface circuitry 702, in-system programming (ISP) circuitry 704, a central processing unit (CPU) 706, an electrically erasable programmable read-only memory (EEPROM) 708, internal oscillator circuitry 710, and input/output (I/O) ports 712. OSC1 and OSC2 are coupled to the oscillator interface circuitry 702. The oscillator interface circuitry 702 is further coupled to the ISP circuitry 704 and the CPU 706. The ISP circuitry 704 is further coupled to the EEPROM 708 and the internal oscillator circuitry 710. The CPU 706 is further coupled to the EEPROM 708, to the internal oscillator circuitry 710, and to the I/O ports 712 (which interface with circuitry outside the microcontroller 604 via I/O pins). In contrast to the present invention, conventional systems couple their in-system programming circuitry to their input/output ports.

FIGS. 8A, 8B, and 8C are circuit diagrams of conventional external oscillation circuits 606. FIG. 8A is a circuit diagram of a conventional crystal oscillator circuit. The crystal oscillator (XTAL) circuit includes a crystal 802 coupled between OSC1 and OSC2, a first capacitor 804 coupled between OSC1 and electrical ground, and a second capacitor 806 coupled between OSC2 and electrical ground.

FIG. 8B is a circuit diagram of a conventional external RC oscillator (XRC) circuit The external RC oscillator circuit includes a resistor 808 coupled between OSC1 and a power supply and a capacitor 810 coupled between OSC1 and electrical ground.

FIG. 8C shows that where an internal RC oscillator (IRC) circuit (i.e. one internal to the microcontroller chip) is used, no external oscillation circuit 606 is necessary.

FIGS. 9A, 9B, and 9C are circuit diagrams of oscillator interface circuitry 702 in a microcontroller 604 according to a preferred embodiment of the present invention. FIG. 9A is a circuit diagram of a first oscillator interface circuit for interfacing with a crystal oscillator circuit (XTAL). The first interface circuit includes: a resistor 902 coupled between OSC1 and OSC2; an inverter 904 coupled between OSC1 and OSC2; a (NMOS) transistor with its source coupled to OSC1, its drain coupled to ground, and its gate coupled to a line for carrying a weak pull-down (weak_pd) signal from the ISP circuitry 704. The first oscillator interface circuit also couples OSC1 and OSC2 to the ISP circuitry 704 and the CPU 706.

FIG. 9B is a circuit diagram of a second oscillator interface circuit for interfacing with an external RC oscillator circuit (XRC). The second interface circuit includes: a Schmitt trigger 908 with its input coupled to OSC1 and its output coupled to the CPU 706; and a (NMOS) transistor 910 with its source coupled to OSC1, its drain coupled to ground, and its gate coupled to the output of the trigger 908. In addition, the second interface circuit couples OSC1 and OSC2 to the ISP circuitry 704.

FIG. 9C is a circuit diagram of a third oscillator interface circuit for the case when an internal RC oscillator (IRC) circuit is used. The third interface circuit includes a NAND gate 912 with a first input coupled to OSC1, a second input coupled to ground, and an output coupled to the CPU 706. Because the second input is ground, the NAND gate 912 outputs high (logical 1) regardless of the first input. This is to prevent the output coupled to the CPU 706 from floating. The third interface circuit also couples OSC1 and OSC2 to the ISP circuitry 704.

Note that a single microprocessor 604 can implement all of the above three interface circuits 702 and use logic to activate the appropriate interface circuit depending on the external oscillator circuitry 606 chosen or being used. Implementing such logic is within the capabilities of one of ordinary skill in the pertinent art.

FIGS. 10A, 10B, and 10C are timing diagrams of signals relating to the method for entering 102 in-system programming mode according to a preferred embodiment of the present invention. The timing diagram of FIG. 10A relates to the case where a crystal oscillator (XTAL) is being used. The in-system programmer 610 first sends 202 a signal to the microprocessor 604 to turn-off the crystal oscillator. The signal is sent 202 in three steps. In the first step 302, the programmer 610 interrupts the normal oscillation on OSC1 and OSC2 by driving and holding the voltage on OSC1 low. Since OSC2 is coupled to OSC1 via an inverter 904, when OSC1 is driven low, OSC2 goes high. In the second step 304, the programmer 610 drives the voltage on OSC2 low also, such that both OSC1 and OSC2 is low. This is an unusual condition given the inverter 904 between OSC1 and OSC2. In the third step 306, the programmer toggles the voltage on OSC1 a plurality of times. More specifically, OSC1 goes from low to high and back to low nine (9) times. The ninth low-to-high transition (i.e. rising edge) of the voltage on OSC1 signals the microcontroller 604 to turn off its circuitry driving OSC1 and OSC2. Thereafter, the programmer 610 releases 204 the voltage on OSC2 such that OSC2 is open drain, and then drives 206 the voltage on OSC1 to a rather high level (Vpp which is typically about 12.5 volts) to enable EEPROM programming. Finally, the microprocessor 604 turns-on 208 an internal oscillator 710 at a frequency (e.g., 128 KHz) for in-system programming.

The timing diagram of FIG. 10B relates to the case where an external RC oscillator (XRC) is being used. The in-system programmer 610 first sends 202 a signal to the microprocessor 604 to turn-off the external oscillator. The signal is sent 202 in three steps. In the first step 302, the programmer 610 interrupts the normal oscillation on OSC1 and OSC2 by driving and holding the voltage on OSC1 low. In the second step 304, the programmer 610 drives the voltage on OSC2 low also, such that both OSC1 and OSC2 is low. In the third step 306, the programmer toggles the voltage on OSC1 a plurality of times. More specifically, OSC1 goes from low to high and back to low nine (9) times. The ninth low-to-high transition (i.e. rising edge) of the voltage on OSC1 signals the microcontroller 604 to turn off its circuitry driving OSC1 and OSC2. Thereafter, the programmer 610 releases 204 the voltage on OSC2 such that OSC2 is open drain, and then drives 206 the voltage on OSC1 to a rather high level (Vpp which is typically about 12.5 volts) to enable EEPROM programming. Finally, the microprocessor 604 turns-on 208 an internal oscillator 710 at a frequency (e.g., 128 KHz) for in-system programming. Note that, as shown in FIG. 10B, the internal oscillator 710 may be turned on 208 after the ninth rising edge but before OSC1 is driven to Vpp.

The timing diagram of FIG. 10C relates to the case where an internal RC oscillator (IRC) is being used. The in-system programmer 610 first sends 202 a signal to the microprocessor 604 to turn-off the normal oscillation of the internal oscillator 710. The signal is sent 202 in two steps. In the first step 304, the programmer 610 drives the voltage on OSC2 low also, such that both OSC1 and OSC2 is low (OSC1 begins low for the IRC case). In the second step 306, the normal oscillation is allowed to toggle its voltage a plurality of times. More specifically, the normal oscillation goes from low to high and back to low nine (9) times. The ninth low-to-high transition (i.e. rising edge) signals the microcontroller 604 to turn off the normal oscillation of the internal oscillator 710. Thereafter, the programmer 610 releases 204 the voltage on OSC2 such that OSC2 is open drain, and then drives 206 the voltage on OSC1 to a rather high level (Vpp which is typically about 12.5 volts) to enable EEPROM programming. Finally, the microprocessor 604 turns-on 208 the internal oscillator 710 at a frequency (e.g., 128 KHz) for in-system programming.

FIG. 11 is a block diagram of in-system programming (ISP) circuitry 704 in a microcontroller 604 according to a preferred embodiment of the present invention. The ISP circuitry 704 includes OSC1/OSC2 control circuitry 1102, a noise filter 1104, and EEPROM programming circuitry 1106. The OSC1/OSC2 control circuitry 1102 is coupled to OSC1 and OSC2 (via the oscillator interface circuitry 702) and is also coupled to send the weak pull-down (weak_pd) signal to the interface circuitry 702. The noise filter 1104 is also coupled to OSC2 (via the interface circuitry 702) and is coupled to send a fall_edge signal to the OSC1/OSC2 control circuitry 1102. The EEPROM programming circuitry 1106 is also coupled to OSC2 (via the interface circuitry 702) and is further coupled to the EEPROM circuitry 708. In particular, programming circuitry 1106 is coupled to send data to EEPROM IN of EEPROM circuitry 708, to receive data from EEPROM OUT of EEPROM circuitry 708, and to send commands via EEPROM CONTROL of EEPROM circuitry 708.

FIG. 12 is a circuit diagram of a noise filter 1104 in a microcontroller according to a preferred embodiment of the present invention. The noise filter 1104 includes a first inverter 1202, a first AND gate 1204, a series of eight (8) D flip-flops 1206–1213, a second AND gate 1214, a ninth D flip-flop 1216, a second inverter 1218, and a third AND gate 1220.

The first inverter 1202 has its input coupled to OSC2 and its output coupled to a first input of the first AND gate 1204. A second input of the first AND gate is coupled to receive a reset signal (rst_). (During normal operation of the microcontroller 604, rst_ is high. The voltage of rst_ becomes low when the microcontroller 604 is reset. When rst_ is low, the noise filter 1104 is effectively disabled since the output of the first AND gate 1204 is then low regardless of the output of the first inverter 1202.)

The output of the first AND gate 1204 is coupled to the R (reset) input of the eight flip-flops 1206–1213 and to the R input of the ninth flip-flop 1216. Those nine flip-flops 1206–1213 and 1216 are also coupled to receive a clock signal (clk). For the XTAL and XRC cases, the clock signal is the signal on OSC1. For the IRC case, the clock signal is the IRC clock signal. The first flip-flop 1206 has its input (D) coupled to receive a power supply (high). The second through seventh flip-flops 1207–1212 each has its input (D) coupled to receive the output (Q0–Q6, respectively) of the immediately prior sequential flip-flop (1206–1211, respectively). In addition, first through eighth flip-flops (1206–1213) each has its output (Q0–Q7, respectively) coupled to one of eight inputs to the second AND gate 1214.

The second AND gate 1216 has its output (Q70) coupled to the input (D) of the ninth flip-flop 1216 and to a first input of the third AND gate 1220. The ninth flip-flop 1216 has its output (Q) coupled to an input of the second inverter 1218. The second inverter 1218 has its output coupled to a second input of the third AND gate 1220. The third AND gate 1220 outputs a signal designated fall_edge. The fall_edge signal indicates to the OSC1/OSC2 control circuitry (1102) that a signal has been sent 202 to turn-off the normal clock.

FIG. 13 is a timing diagram of signals in the noise filter according to a preferred embodiment of the present invention. The CLK signal corresponds to the signal on OSC1 for the XTAL and XRC cases, and the IRC clock signal for the IRC case. The output of the noise filter is the fall_edge signal. The OSC1/OSC2 control circuitry receives the fall_edge signal and causes an oscillator enable (OSC_EN) signal to transition from high to low.

Referring back to FIGS. 10A–C, the falling edge of the OSC_EN signal triggers the OSC1/OSC2 control circuitry 1102 to release 204 the voltage on OSC2 and subsequently to drive 206 OSC1 to Vpp and cause the internal oscillator 710 to generate 208 a clock at the programming frequency (e.g., 128 KHz). In addition, for the XTAL case, the falling edge of the OSC_EN signal triggers the weak_pd signal to go high, which temporarily pulls down the voltage on OSC1 before the voltage on OSC1 is driven to Vpp.

FIG. 14 is a diagram of EEPROM programming circuitry 1106 in the microcontroller 604 according to a preferred embodiment of the present invention. The programming circuitry 1106 includes a trigger 1402, a first XOR gate 1404, encryption logic 1406, a data shift register 1408, a command shift register 1410, a command decode circuit 1412, a second XOR gate 1414, a transistor 1416, and a resistor 1418. The input of the trigger 1402 has its input coupled to receive the signal on OSC2 and its output coupled to a first input of the first XOR gate 1404. The first XOR gate 1404 has a second input coupled to receive an output from encryption logic 1406 and its output coupled to an input of a data shift register 1408 and an input of a command shift register 1410. The encryption logic 1406, the data shift register 1408, and the command shift register 1410 are each coupled to receive a program clock from the internal oscillator 710. The program clock may be, for example, at 128 KHz. The data shift register 1408 has its output coupled to the EEPROM IN input of the EEPROM circuitry 708. The command shift register 1410 has its output coupled to an input of the command decode circuit 1412. The command decode circuit 1412 has its output coupled to the EEPROM CONTROL input of the EEPROM circuitry 708. The encryption logic has its output further coupled to a first input of the second XOR gate 1414. The second XOR gate has another input coupled to receive data signals from the EEPROM OUT output of the EEPROM circuitry 708. The second XOR gate has its output coupled to a gate of the transistor 1416. The transistor 1416 has its source coupled to OSC2 and its drain coupled to ground. The resistor 1418 is coupled between a power supply and OSC2.

FIG. 15 is a timing diagram of the in-system programming protocol according to a preferred embodiment of the present invention. The protocol includes frames. In a preferred embodiment, each frame includes a synchronization (sync) cycle, four command cycles (so there can be up to 16 different ISP commands), and twelve data cycles (since the microcontroller being programmed uses 12-bit instruction words). Each cycle is as long as four (4) periods of the programming clock. The frame begins with a sync cycle. During the entire sync cycle (i.e. for all four clock periods), the voltage on OSC2 is high. In contrast, for each command or data cycle, the voltage on OSC2 is driven low during the second clock period (period 1) of the cycle. [The voltage on OSC2 is still high during the first clock period (period 0) of the cycle.] Each command cycle corresponds to a bit transmitted from the programmer 610 to the microcontroller 604. Each data cycle corresponds to a bit transmitted either (a) from the programmer 610 to the microcontroller 604, or (b) from the microcontroller 604 to the programmer 610. During the third and fourth clock periods (periods 2 and 3), if the voltage on OSC2 is high, then the command or data cycle represents a logical 1. On the other hand, if the voltage on OSC2 is low during the third and fourth clock periods, then the command or data cycle represents a logical 0. Sampling is performed at the edge between the third and fourth clock periods of each command or data cycle in order to determine the logical value. In-system programming (ISP) commands for programming an EEPROM are known and can be utilized by one skilled in the pertinent art.

The above description is included to illustrate the operation of preferred embodiments and is not meant to limit the scope of the invention. The scope of the invention is to be limited only by the following claims. From the above discussion, many variations will be apparent to one skilled in the art that would yet be encompassed by the spirit and scope of the invention.

What is claimed is:

1. A method for programming a memory on an integrated circuit including entering a programming mode of the integrated circuit, wherein entering the programming mode comprises:
   turning-off a first oscillation signal of a first frequency within the integrated circuit; and
   turning-on a second oscillation signal of a second frequency within the integrated circuit.

2. The method of claim 1, wherein turning-off the first oscillation signal comprises:
   driving a first voltage to a first level on a first pin;
   driving a second voltage to a second level on a second pin; and
   toggling the first voltage between two levels a plurality of times.

3. The method of claim 2, wherein the first level is equal to the second level.

4. The method of claim 2, wherein entering the programming mode further comprises:
   releasing the second voltage on the second pin; and
   driving the first voltage on the first pin to a higher level to enable the programming.

5. The method of claim 1, wherein the programming mode comprises:
   sending a synchronization signal to the integrated circuit;
   sending/receiving a data signal to/from the memory on the integrated circuit; and
   repeating sending the synchronization signal, sending the command signal, and sending/receiving the data signal.

6. The method of claim 1, further comprising: exiting the programming mode, wherein exiting the programming mode comprises:

lowering a relatively high voltage level applied to the integrated circuit to signal the exiting; and resetting the integrated circuit.

7. A method for programming a memory on an integrated circuit comprising:

sending a periodic carrier signal with a frequency equal to a frequency of a clock internal to the integrated circuit;

modulating a plurality of cycles of the periodic carrier signal to send a command to the integrated circuit; and modulating a plurality of cycles of the periodic carrier signal to send/receive data to/from the memory on the integrated circuit.

8. The method of claim 7, further comprising:

modulating a cycle of the periodic carrier signal to send a synchronization signal to the integrated circuit.

9. The method of claim 8, wherein the synchronization signal, the command, and the data form a frame.

10. An integrated circuit device comprising:

a processing unit;

an EEPROM for providing instructions to the processing unit;

an oscillator for providing a clock to the processing unit;

programming circuitry for programming the EEPROM;

a first pin for providing timing to the oscillation circuitry during an operating mode and for providing a relatively high voltage to the EEPROM during a programming mode; and a second pin for communicating with the EEPROM.

11. The integrated circuit device of claim 10, wherein the device comprises a microcontroller.

12. An integrated circuit comprising:

a processing unit;

an EEPROM for providing instructions to the processing unit;

an oscillator for providing a clock to the processing unit;

oscillation circuitry for coupling the oscillator to the processing unit; and in-system programming circuitry coupled to the oscillation circuitry for entering, exiting, and performing in-system programming responsive to signals received from the oscillation circuitry.

13. The apparatus of claim 12 further comprising:

at least one oscillation pin, coupled to the oscillation circuitry, for receiving externally generated oscillation signals and programming signals.

* * * * *